(12) United States Patent
Melloni

(10) Patent No.: US 11,088,713 B1
(45) Date of Patent: Aug. 10, 2021

(54) SOLID STATE DRIVE IMPLEMENTING A RATE-COMPATIBLE POLAR CODE

(71) Applicant: Diego Melloni, Rovigo (IT)

(72) Inventor: Diego Melloni, Rovigo (IT)

( * ) Notice: Subject to any disclaimer, the term of this patent is extended or adjusted under 35 U.S.C. 154(b) by 15 days.

(21) Appl. No.: 16/748,002

(22) Filed: Jan. 21, 2020

(51) Int. Cl.
*H03M 13/00* (2006.01)
*H03M 13/45* (2006.01)
*H03M 13/13* (2006.01)
*H03M 13/21* (2006.01)
*H03M 13/29* (2006.01)

(52) U.S. Cl.
CPC ....... *H03M 13/618* (2013.01); *H03M 13/134* (2013.01); *H03M 13/21* (2013.01); *H03M 13/2927* (2013.01); *H03M 13/45* (2013.01); *H03M 13/615* (2013.01)

(58) Field of Classification Search
CPC .................................................. H03M 13/618
See application file for complete search history.

(56) References Cited

U.S. PATENT DOCUMENTS

| 2016/0294418 A1* | 10/2016 | Huang | H03M 13/13 |
| 2018/0097580 A1* | 4/2018 | Zhang | H04L 1/0063 |
| 2020/0099469 A1* | 3/2020 | Jiang | H04L 1/0057 |

\* cited by examiner

*Primary Examiner* — Joseph D Torres
(74) *Attorney, Agent, or Firm* — Janeway Patent Law PLLC; John M. Janeway

(57) ABSTRACT

A method for extending a polar code by determining an extension number E such that E/2<N<E whereby N is a number of codeword bits for a polar code that is to be extended and extending a codeword by adding additional redundant/extension bits. Information indicative of a bit unreliability associated with each bit in the codeword is accessed and bit positions with the highest unreliabilities are selected. Input data for an extended codeword is determined by adding a number of redundant bits in the respective selected bit positions.

13 Claims, 8 Drawing Sheets

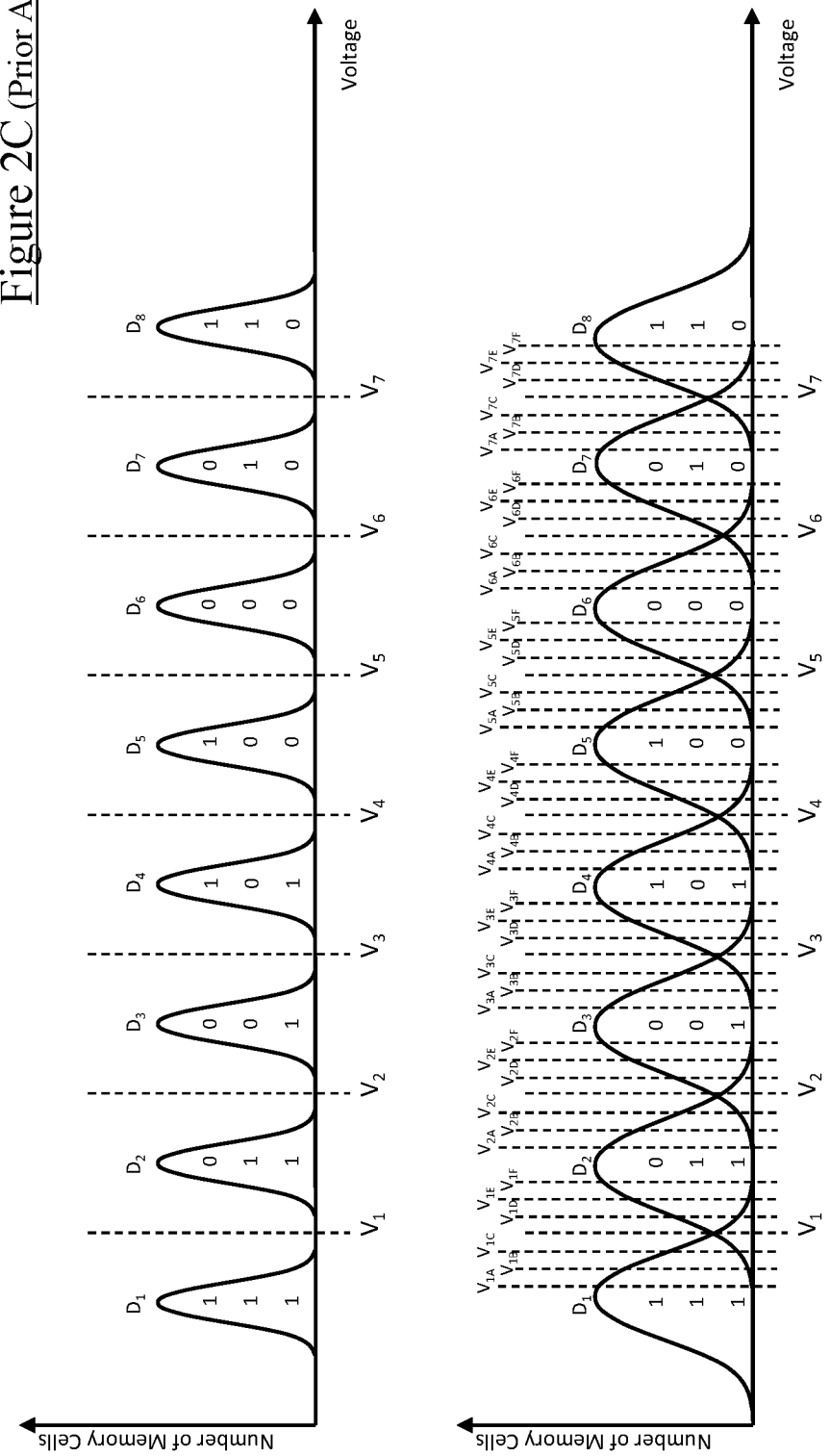

SOLID STATE DRIVE IMPLEMENTING A RATE-COMPATIBLE POLAR CODE

BACKGROUND OF THE INVENTION

Field of the Invention

The present invention generally relates to solid state storage devices (hereinafter, "Solid State Drives" or SSD devices), such as SSD devices based on non-volatile memory cells (e.g., NAND flash memory cells) for storing data. Particularly, the present invention relates to SSD devices provided with error correction capabilities. More particularly, the present invention relates to SSD devices (or controllers thereof) implementing a polar code with variable code rates.

Overview of the Related Art

Nowadays, the ever-developing digital technologies allow achieving extremely high communication speeds. However, traditional hard disk drives (HDD) can no longer meet the throughput and latency requirements of most state-of-the-art application scenarios. To this end, SSD devices, which feature low access time, high compactness, and low noise, have become increasingly popular for storage market.

SSD devices are mainly based on NAND flash memory cells. As the required storage density increases, most SSD devices consider to store more than two bits in a single memory cell; the more bits are stored in a single memory cell, the worse raw error performance. Therefore, powerful forward-error correction (FEC) methods are required, and voluminous researches on conventional error correction code (ECC code) schemes for SSD devices emerge.

During the last few years, it is becoming increasingly common the use of polar codes as error correction codes (see, for example, E. Arikan, "*Channel polarization: A method for constructing capacity-achieving codes for symmetric binary-input memoryless channels*", IEEE Trans. Inf. Theory, 2009, vol. 55, no. 7, pp. 3051-3073; C. Zhang, B. Yuan, K. K. Parhi, "*Reduced-latency sc polar decoder architectures*", Proceedings of IEEE International Conference on Communications (ICC), 2012, pp. 3471-3475; and C. Zhang, K. K. Parhi, "*Low-latency sequential and overlapped architectures for successive cancellation polar decoder*", IEEE Trans. Signal Process, 2013, vol. 61, no. 10, pp. 2429-2441).

Compared to traditional error correction codes, such as LDPC ("*Low-Density Parity-Check*") codes, polar codes have shown capacity-achieving performance (i.e., the performance of the polar codes may arbitrarily close to the Shannon limit).

Besides good performance over binary-input discrete memoryless channels, polar code encoding and decoding complexity is much lower than that of LDPC codes.

SUMMARY OF THE INVENTION

The Applicant has recognized that SSD devices based on polar codes are not completely satisfactory for all modern technological requirements and applications.

According to the Applicant, this is substantially due to the fact that the SSD devices based on polar codes are not easily adaptable to the user's requests, as discussed here below.

The SSD devices may be employed in a wide variety of applications, and, for each application, the SSD devices typically experience very different stresses during their lifetime.

In order to adapt the SSD devices to the experienced stresses, parameters such as code rate (i.e., the proportion of the useful, non-redundant bits included in a codeword with respect to an overall number of non-redundant and redundant bits making up the codeword) have to be accordingly changed during SSD device lifetime.

Whilst in LDPC codes changing the code rate may be performed, for example, by "puncturing" operations (i.e., removal of redundant or parity bits) and/or "shortening" operations (i.e., removal of non-redundant or information bits), similar operations in polar codes are heavily affected by the positions of the bits to remove and hence may impair encoding and decoding operations.

Therefore, no SSD devices currently exist that are capable of performing encoding and decoding operations based on polar codes, while allowing adaptability of the code rate.

The Applicant has tackled the above-discussed issues, and has devised a SSD device (and a corresponding method performed by the SSD device) implementing a rate-compatible polar code in which the code rate can be dynamically changed or adapted or adjusted by the user according to the specific application of the SSD device and during the lifetime of the SSD device.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method comprising:

receiving input data to be stored in a solid state storage device, the input data including an array of information bits in a number equal to a first number;

encoding, through a polar code, said input data into a codeword having an array of codeword bits in a number equal to a second number, the codeword bits including said information bits and a plurality of frozen bits, wherein said second number is variable by a user over a lifetime of the solid state storage device to obtain variable code rates;

storing the codeword in the solid state storage device;

reading the codeword from the solid state storage device;

decoding the codeword being read from the solid state storage device in order to obtain output data corresponding to the input data;

wherein said encoding comprises:

determining a third number as the lowest power of two number that is higher than said second number;

accessing an information content stored in the solid state storage device, the information content being indicative of a bit unreliability associated with each bit position in said array of codeword bits;

selecting, among the bit positions in the information content, the bit positions associated with a number of highest bit unreliabilities equal to a fourth number, to obtain selected bit positions, said fourth number being equal to a difference between the third number and the second number;

determining extended input data by adding to the input data a number of redundant bits equal to said fourth number, wherein said adding comprises adding, in the input data, the number of redundant bits in the respective selected bit positions;

through the polar code, encoding the extended input data and a number of frozen bits equal to a difference between the second number and the first number, thereby obtaining an extended codeword including said codeword;

wherein said storing the codeword, said reading the codeword and said decoding the codeword include storing the extended codeword, reading the extended codeword and decoding the extended codeword, respectively, and wherein the method further comprises, after said decoding, deleting said added number of redundant bits in order to obtain the output data.

According to an embodiment, the information content comprises at least one list each one including an ordered succession of elements, the elements of the at least one list being indicative each one of a respective bit position in the array of codeword bits and being ordered in the succession by decreasing bit unreliabilities associated with the respective bit positions. According to an embodiment, said selecting, among the bit positions in the information content, the bit positions associated with a number of highest bit unreliabilities equal to a fourth number comprises selecting a number of first elements of the at least one list equal to the fourth number.

According to an embodiment, said at least one list comprises a plurality of lists each one associated with a respective third number. According to an embodiment, said selecting, among the bit positions in the information content, the bit positions associated with a number of highest bit unreliabilities equal to a fourth number comprises:

according to the determined third number, selecting a list among the plurality of lists, and selecting a number of first elements of the selected list equal to the fourth number.

According to an embodiment, said encoding the extended input data and a number of frozen bits equal to a difference between the second number and the first number is based on Bhattacharyya rule.

Another aspect of the present invention relates to a controller for a solid state storage device. The controller comprises:

an interface unit for receiving input data to be stored in the solid state storage device, the input data including an array of information bits in a number equal to a first number;

an encoding unit for encoding, through a polar code, said input data into a codeword having an array of codeword bits in a number equal to a second number, the codeword bits including said information bits and a plurality of frozen bits, wherein said second number is variable by a user over a lifetime of the solid state storage device to obtain variable code rates;

a storing unit for storing the codeword in the solid state storage device;

a reading unit for reading the codeword from the solid state storage device;

a decoding unit for decoding the codeword being read from the solid state storage device in order to obtain output data corresponding to the input data;

According to an embodiment, said encoding unit is configured to:

determine a third number as the lowest power of two number that is higher than said second number;

access an information content stored in the solid state storage device, the information content being indicative of a bit unreliability associated with each bit position in said array of codeword bits;

select, among the bit positions in the information content, the bit positions associated with a number of highest bit unreliabilities equal to a fourth number, to obtain selected bit positions, said fourth number being equal to a difference between the third number and the second number;

determine extended input data by adding to the input data a number of redundant bits equal to said fourth number, wherein said adding comprises adding, in the input data, the number of redundant bits in the respective selected bit positions;

through the polar code, encode the extended input data and a number of frozen bits equal to a difference between the second number and the first number, thereby obtaining an extended codeword including said codeword.

According to an embodiment, said storing unit, said reading unit and said decoding unit are configured to store the extended codeword, read the extended codeword and decode the extended codeword, respectively.

According to an embodiment, the controller is configured to, after said decoding, delete said added number of redundant bits in order to obtain the output data.

According to an embodiment the information content comprises at least one list each one including an ordered succession of elements, the elements of the at least one list being indicative each one of a respective bit position in the array of codeword bits and being ordered in the succession by decreasing bit unreliabilities associated with the respective bit position.

According to an embodiment, the encoding unit is configured to select, among the bit positions in the information content, the bit positions associated with a number of highest bit unreliabilities equal to a fourth number by selecting a number of first elements of the at least one list equal to the fourth number.

According to an embodiment, said at least one list comprises a plurality of lists each one associated with a respective third number. According to an embodiment, the encoding unit is configured to select, among the bit positions in the information content, the bit positions associated with a number of highest bit unreliabilities equal to a fourth number by:

selecting a list among the plurality of lists according to the determined third number, and selecting a number of first elements of the selected list equal to the fourth number.

According to an embodiment, the encoding unit is configured to encode the extended input data and a number of frozen bits equal to a difference between the second number and the first number based on Bhattacharyya rule.

BRIEF DESCRIPTION OF THE ANNEXED DRAWINGS

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to an embodiment of the present invention;

DETAILED DESCRIPTION OF PREFERRED EMBODIMENTS OF THE INVENTION

Figure 1A:
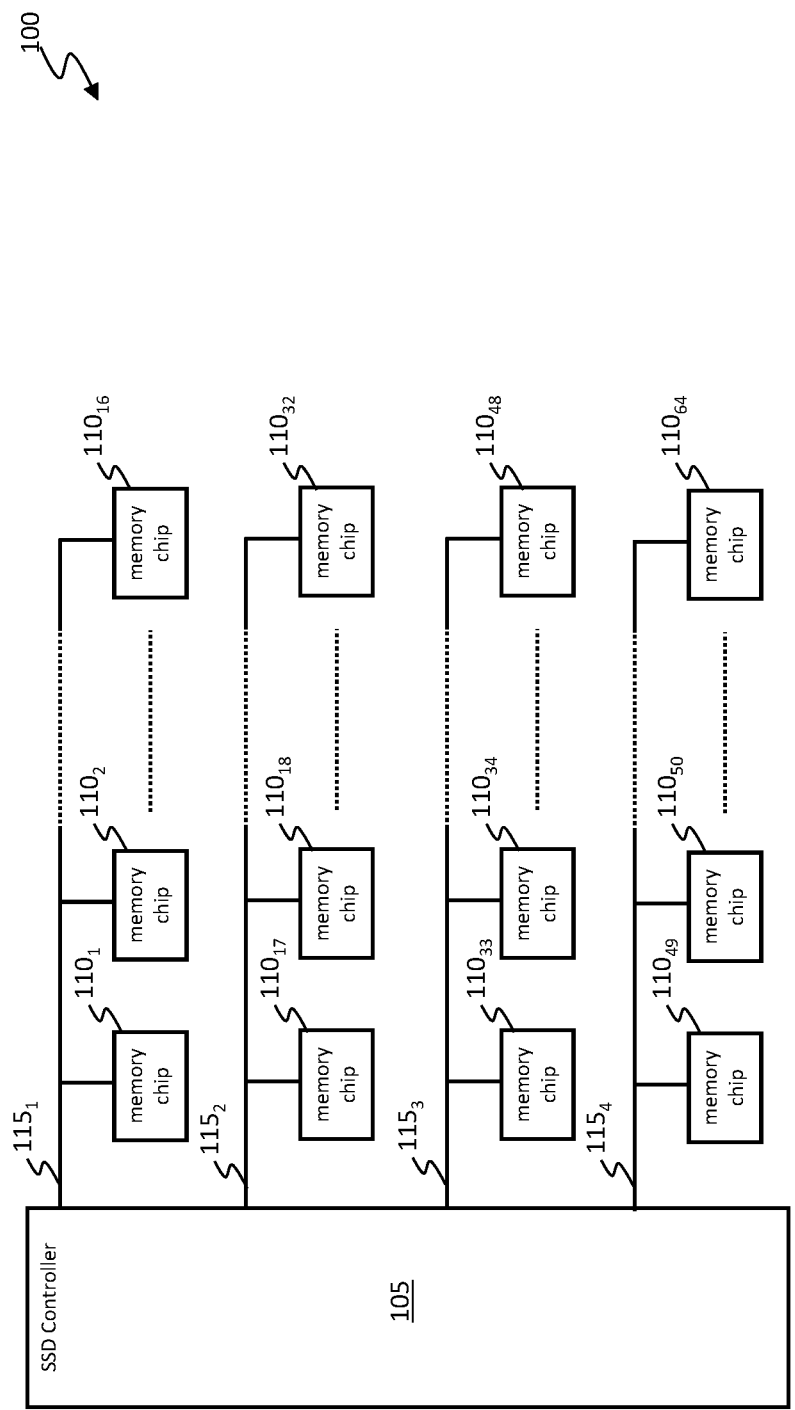

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_m$ for storing bits even in the absence of external power supply (m=1, 2, 3, . . . , with M=64 in the example at issue), and a plurality of (e.g., synchronous and/or asynchronous) channels $115_h$ (h=1, 2, 3, . . . , H, with H=4 in the example at issue) communicably coupling the SSD controller 105 and the memory chips $110_m$ to each other—in the exemplary illustration, each channel $115_h$ communicably couples the SSD controller 105 to a set of 16 memory chips $110_m$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

Figure 1B:
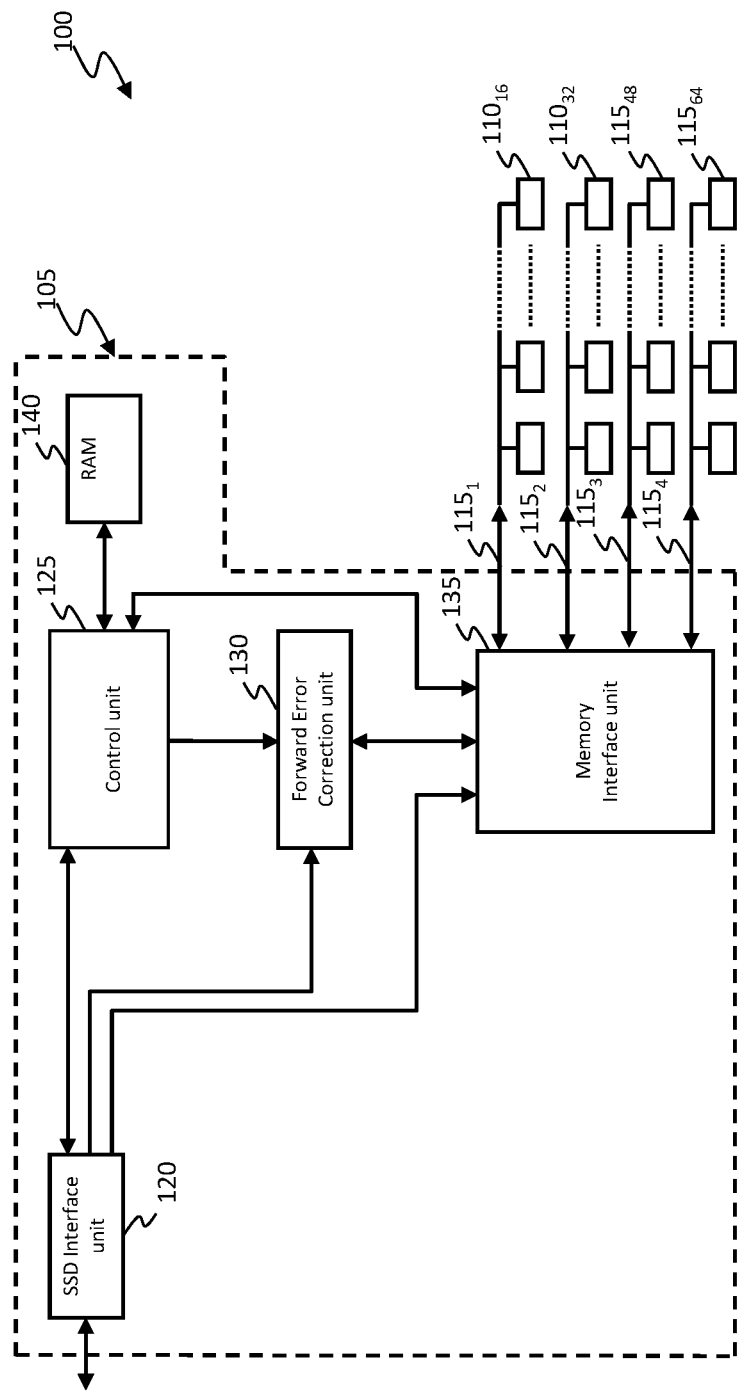

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_m$ and the channels $115h$ (only some of them being numbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but is not limited to, information bits to be stored (i.e., the information bits to be written in the memory chips $110_m$), read information bits (i.e., the information bits stored in, and read from, the memory chips $110_m$), user commands indicative of the operations to be performed by the SSD controller 105 on the memory chips $110_m$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_m$ along the channels $115h$ and bit transport to and from the SSD interface unit 120, and coordinating enabling and/or disabling of the memory chips $110_m$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_m$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_m$ along the respective channels $115h$, the SSD controller 105 comprises one (as herein exemplary illustrated) or more memory interface units 135—alternatively, a memory interface unit 135 for each channel $115_h$ may be provided, or a memory interface unit 135 for each memory chip $110_m$, or for each group of memory chips $110_m$ may be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_m$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_m$ may comprise one or more flash memory dice.

Figure 2A:
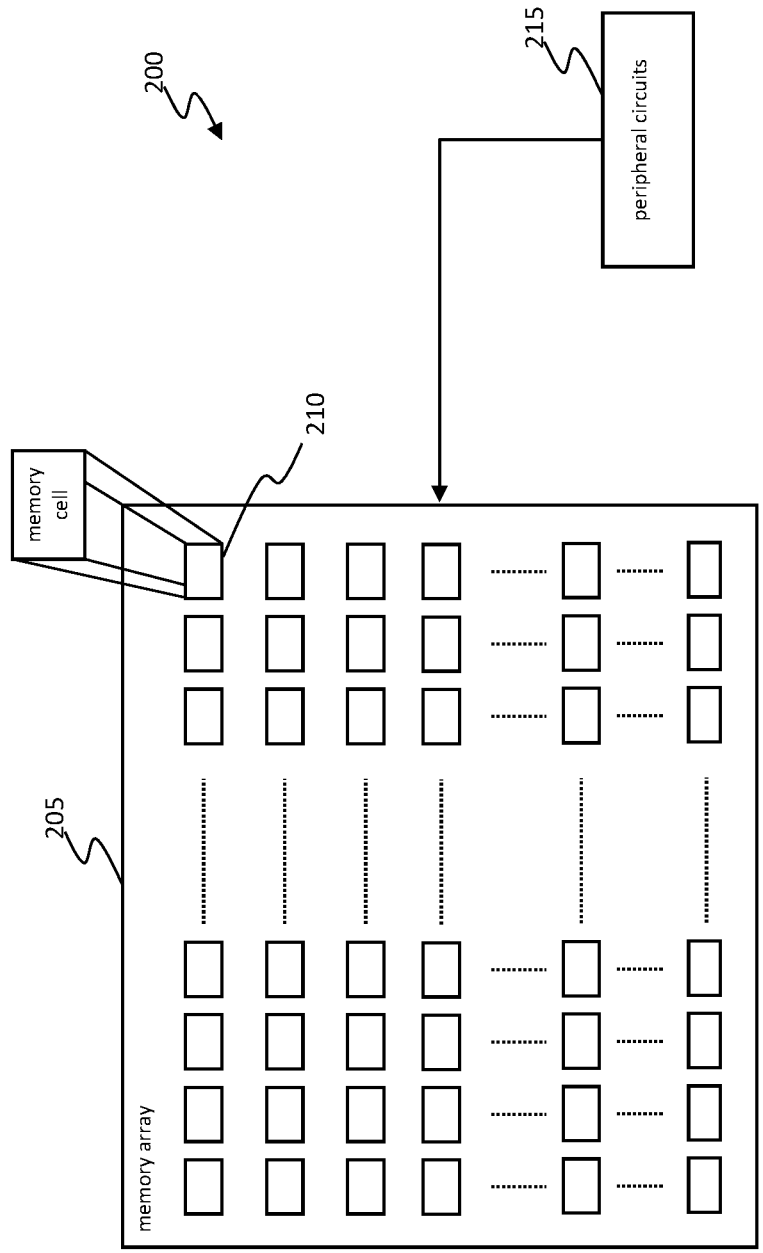

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 preferably comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining, i.e. being associated with, two threshold voltages), in "Multi-Level Cell" (MLC) technology each memory cell (or MLC memory cell) is capable of storing one symbol (or bit pattern) comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol (or bit pattern) comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take (j=1, 2, . . . , 4 for a MLC memory cell, and j=1, 2, . . . , 8 for a TLC memory cell). This is schematically shown in the top drawing of FIG. 2B for a MLC memory cell and in the top drawing of FIG. 2C for a TLC memory cell.

Figure 2B:
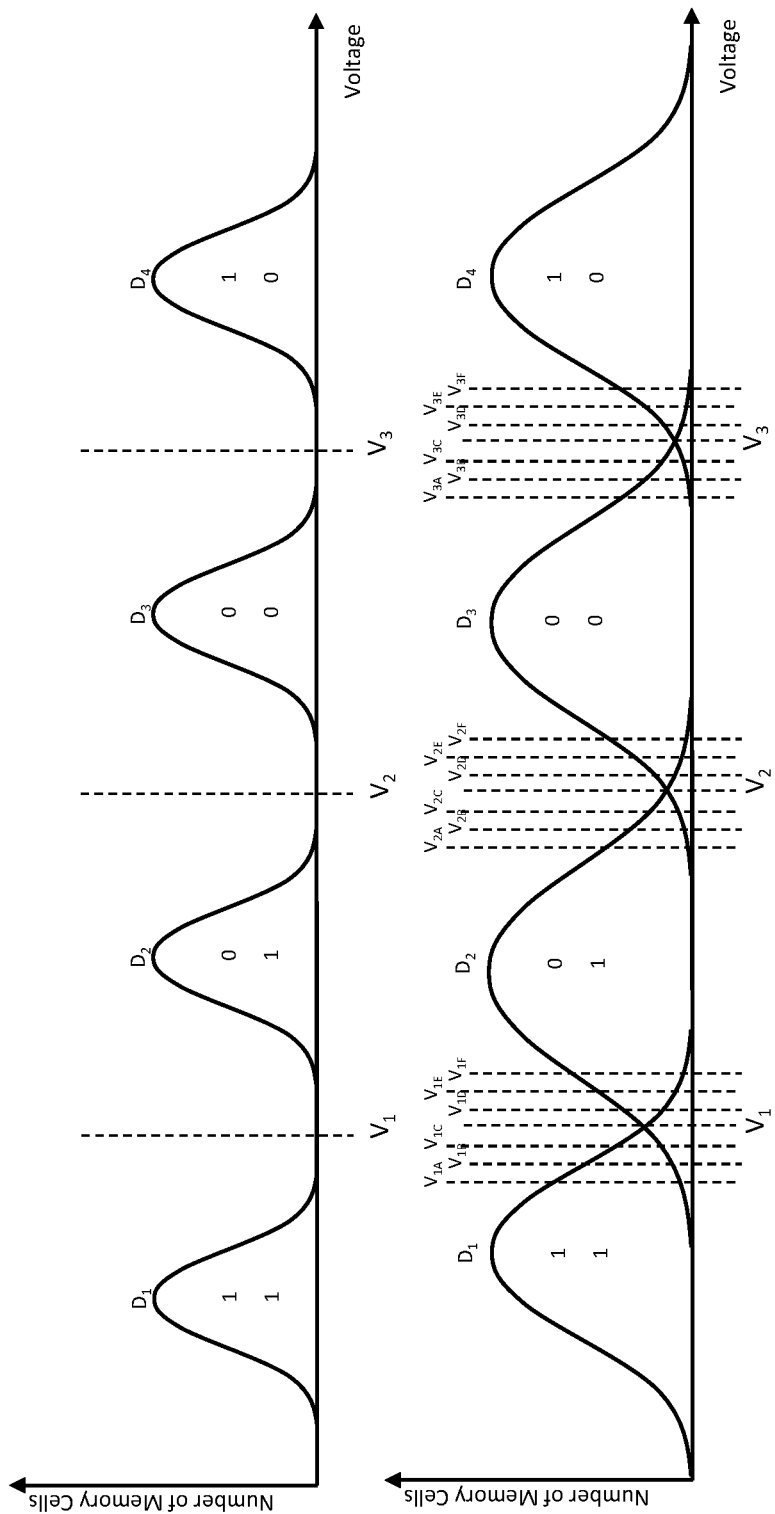

The threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C; k would instead be equal to 1 in case of a SLC memory cell).

In the case of SLC memory cell, not shown, during a read operation a threshold voltage below the hard reference voltage $V_1$ represents the symbol "1", and a threshold voltage above the hard reference voltage $V_1$ represents the symbol "0".

In the case of MLC memory cell, during a read operation, a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10" (see top drawing of FIG. 2B).

In the case of TLC memory cell, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110" (see top drawing of FIG. 2C).

To read a memory cell 210, the threshold voltage of the memory cell 210 is compared to the hard reference voltages $V_k$. For example, reading a memory cell 210 that stores a symbol of m bits may require, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

Back to FIG. 2A, the memory die 200 preferably comprises peripheral circuits, e.g. including storing and reading units (such as decoders, multiplexers, drivers, buffers, sense amplifiers). The peripheral circuits are not relevant for the present description, and are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIGS. 2B and 2C) and, hence, into increasing of the probability of the number of bit errors per unit time (i.e., the RBER).

Figure 3A:
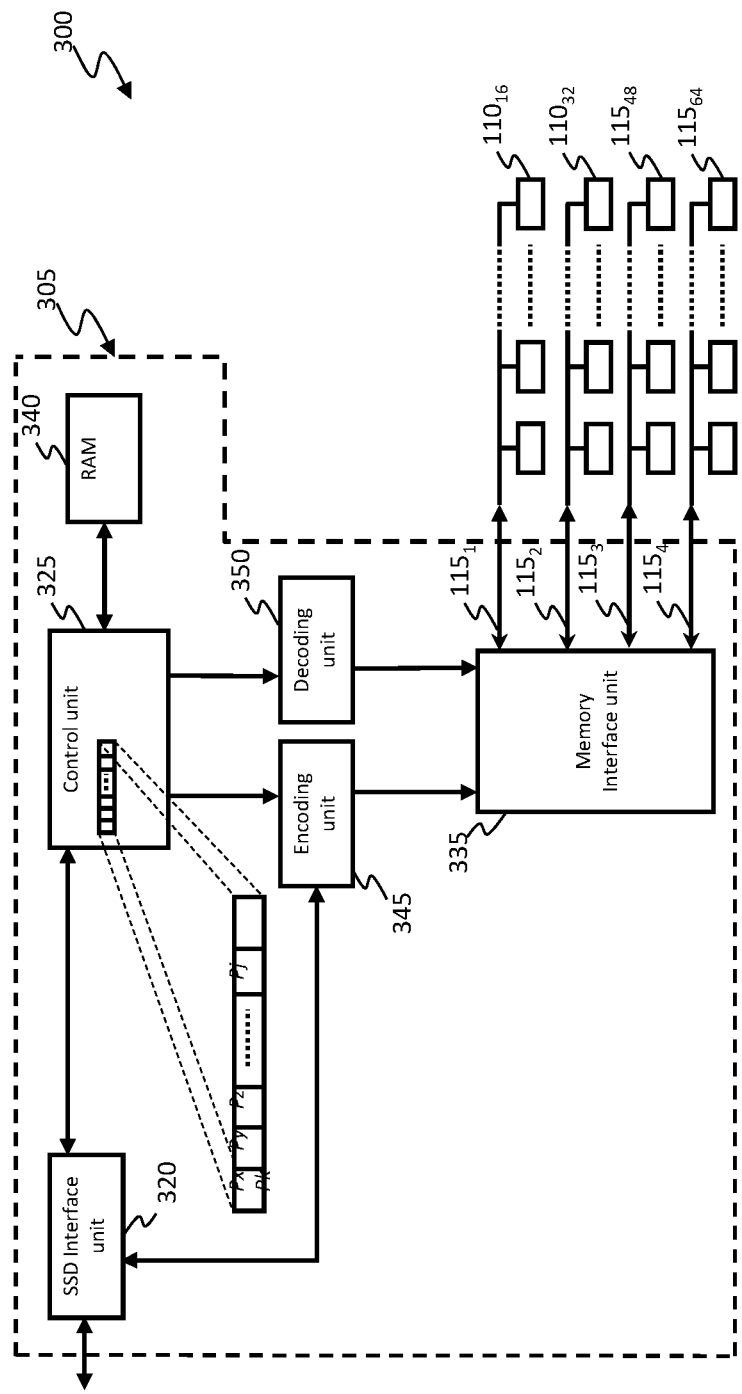
FIG. 3B shows an exemplary encoding scheme of polar encoding.

With reference now to FIG. 3A, it schematically shows, in terms of operating units, a simplified architecture of a SSD controller 305 according an embodiment the present invention. For the sake of completeness, such a figure also shows, in a smaller size, the memory chips $110_m$ and the channels $115_h$ (only some of them being numbered in such a figure for ease of illustration), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also be intended to represent corresponding method steps of a method according to the present invention.

As visible in the figure, the SSD controller 305 comprises a SSD interface 320, a control unit 325, a memory interface unit 335, and a memory unit 340, which are respectively similar to the SSD interface 120, the control unit 125, the memory interface unit 135, and the memory unit 140 of the SSD controller 105, and therefore they will not be discussed again for the sake of conciseness.

According to an embodiment of the present invention, the control unit 325 is configured to store, e.g. in a proper memory location thereof, an information content indicative of a bit unreliability associated with each bit position in an array of bits, the information content being for example determined in a characterization phase of the SSD device 300.

According to an embodiment, the information content includes one or more lists each one including an ordered succession of elements. Preferably, the elements of each list are indicative each one of a respective bit position in the array of bits. More preferably, the elements of each list are ordered in the succession by decreasing bit unreliabilities associated with the respective bit positions, the direction of the decreasing order being herein intended from left to right of the list.

In other words, according to the preferred embodiment herein considered, the information about the bit unreliability is associated with the position taken by each element (in turn identifying the bit position in the array) in the respective list.

In the example of information content of FIG. 3A, a single list of elements [Px, Py, Pz, . . . Pj, Pk] is illustrated. This graphical representation is aimed at conceptually representing the fact that:
the bit in the position Px has a higher bit unreliability than the bits in the positions [Py, Pz, . . . Pj, Pk];
the bit in the position Py has a higher bit unreliability than the bits in the positions [Pz, . . . Pj, Pk], and
the bit in the position Pj has a higher bit unreliability than the bits in the position Pk.

According to an alternative embodiment, a plurality of (e.g., two or more) lists are stored in the SSD device 300 (e.g., in the control unit 325 thereof), as better discussed in the following.

As better discussed in the following, the information content is used to properly add a number of extension bits to adapt an input data length to a desired codeword length, and is conceptually different from an reliability of read (hard and soft) bits (e.g., in the form of LLR values) which is discussed here below: indeed, information content is indicative of a bit unreliability/reliability associated with the bit position, whereas an LLR value is indicative of a bit unreliability/reliability associated with overlapping threshold voltage distributions.

The SSD controller 305 also comprises an encoding unit 345 for encoding the bits to be stored in the memory array 205 (i.e., the information bits) by means of an ECC code, and a decoding unit 350 for decoding the read bits and determining the information bits. According to an embodiment of the present invention, the encoding 345 and decoding 350 units are implemented in the FEC unit (not shown in this figure).

Preferably, the ECC code is an ECC code allowing soft decoding—or, otherwise stated, an ECC code that allows determining each bit value (or bit pattern value or symbol value, when considering MLC and TLC memory cells) by means of hard bits (i.e., the read bits resulting from comparisons to the hard reference voltages $V_k$) and of additional information including soft bits and an indication of the reliability of each read (hard and soft) bit. The soft bits preferably arise from multiple read operations. Indeed, when a read operation takes place on the selected memory cells, and the number of bit errors is found to be higher than correction capabilities of the "Forward Error Correction", the SSD controller 305 is configured to reread the selected memory cells at different values of the reference voltages to attempt to establish the bits in those areas of the threshold voltage distributions $D_j$ wherein bit error is most likely. As visible in the bottom drawings of FIGS. 2B and 2C, such multiple readings are carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$—the read operations at the soft reference voltages $V_{kA}$-$V_{kF}$ provide the soft bits, and are typically denoted as soft read operations (as opposed to the read operations at the hard reference voltages $V_k$ providing the hard bits, which are typically denoted by hard read operations). In other words, the soft bits and the indication of the reliability of the read (hard and soft) bits provide additional information that can be used by the decoding unit to speed up and/or to quickly converge. By way of example only, the soft reference voltages $V_{kA}$-$V_{kC}$ may be obtained by progressively decreasing the hard reference voltage $V_k$ by a 0.5V step, whereas the soft reference voltages $V_{kD}$-$V_{kF}$ may be obtained by progressively increasing the hard reference voltage $V_k$ by a 0.5V step.

Preferably, the indication of the reliability of the read (hard and soft) bits is in the form of "Log Likelihood Ratio" values (LLR, hereinafter, LLR values) associated with those bits (in other words, each LLR value is a weight indicative of the probability that the read bit is correct). By way of example only, in order to meet one or more parity checks of the ECC code, an LLR value higher than 0 may indicate a bit that is more likely a 0 than a 1, while an LLR value lower than 0 may indicate a bit that is more likely a 1 than a 0. Further, a greater magnitude of the LLR value may indicate a higher probability or reliability. Thus, a bit with an LLR value equal to 15 is more likely to be a 0 than a bit with an LLR value equal to 5, and a bit with an LLR value equal to −15 is more likely to be a 1 than a bit with an LLR value equal to −5. An LLR value equal to 0 may instead indicate that the bit is equally likely to be a 0 or a 1 (and therefore correspond to a complete uncertainty about the bit value, i.e. the estimation is completely unreliable).

According to an embodiment of the present invention, the ECC code is a polar code—hence, the corresponding encoded bits will be referred to as polar encoded bits (or codeword). Although not shown, the polar encoded bits are properly mapped into mapped polar encoded bits (the mapped polar encoded bits representing the symbols to be written/programmed), thereafter the symbols can be stored in the memory chips $110_m$ (by means of the memory interface unit 335 that transmits the symbols to the memory chips $110_m$, and thanks to control unit 325 action that controls addressing of the memory chips $110_m$ to be written/programmed). After a read operation, the read symbols are properly demapped (demapping and mapping operations being substantially reverse operations with respect to each other), therefore the (demapped) read symbols are decoded by the decoding unit 350 in order to extract the respective information bits.

Polar codes were introduced in 2009 (see E. Arikan, "*Channel Polarization: A method for Constructing Capacity Achieving Codes for Symmetric Binary-Input Memoryless Channels*," IEEE Trans. Inform. Theory, vol. 55, pp. 3051-3073 (2009), and E. Arikan and E. Telatar, "*On the Rate of Channel Polarization*" in Proc. IEEE Int'l Symp. Inform. Theory, Seoul, South Korea, pp. 1493-1495 (2009)).

A polar code is a linear ECC code which is provably capacity-achieving.

Polar encoding can be described as follows. A number N of bits $u_i=(u_1, u_2, \ldots, u_N)$ including K information bits (which are variable bits) and N−K frozen bits (which are fixed bits) are transformed into a codeword having a number N of codeword bits $x_i=(x_1, x_2, \ldots, x_N)$ through the linear transformation:

$$x_i = u_i G_N, \text{ with } G_N = B_N G_2^{\oplus n}$$

where:

$$-G_2 \triangleq \begin{bmatrix} 1 & 0 \\ 1 & 1 \end{bmatrix};$$

$G_N$ is called generator matrix of size N×N;
$B_N$ is a N×N bit-reversal permutation matrix, and
"⊕n" denotes the n-th Kronecker power.

Therefore, the polar encoded bits include the information and frozen bits encoded with a polar code.

The N−K frozen bits are used as a reference by the decoding algorithm implemented in the decoding unit 350 to determine whether an error has occurred due to noise in the channel $115_h$ (for example during storing and/or reading of the polar encoded bits into and/or from, respectively, the memory cells of the SSD device). For example, the known value (typically "0") of a frozen bit may be compared to the value determined through the decoding algorithm, to determine whether an error has occurred. When the polar encoded bits stored in the memory cells of the SSD device are read, and demapped, the read polar encoded bits include the frozen bits (which are fixed, and hence known and unchanged) and unfrozen bits indicative of said information bits (the unfrozen bits therefore corresponding to the information bits resulting from the read operation and whose decoding and error correction allow retrieving the original information bits).

Figure 3B:
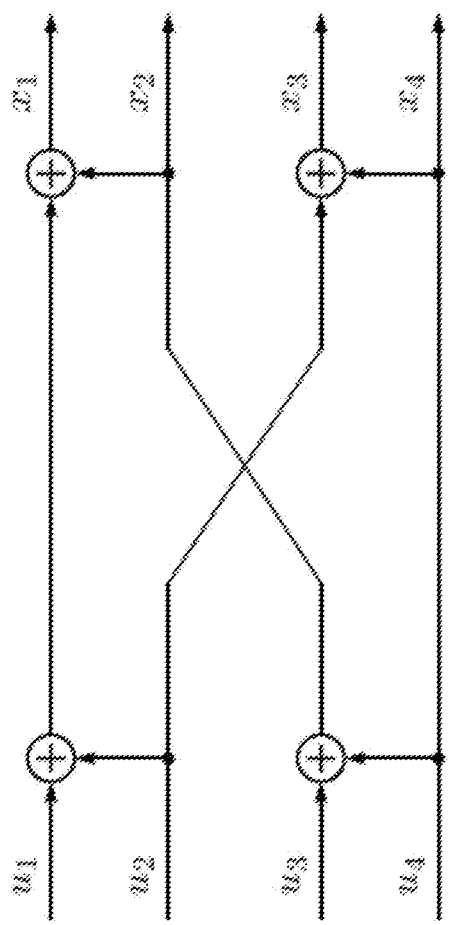

FIG. 3B shows an exemplary encoding scheme of polar encoding for N=4 bits. In this case, the generator matrix $G_4$ is:

$$G_4 = \begin{bmatrix} 1 & 0 & 0 & 0 \\ 1 & 0 & 1 & 0 \\ 1 & 1 & 0 & 0 \\ 1 & 1 & 1 & 1 \end{bmatrix}$$

and $x_i=[x_1=(u_1 \oplus u_2 \oplus u_3 \oplus u_4); x_2=(u_3 \oplus u_4); x_3=(u_2 \oplus u_4); x_4=u_4]$.

As mentioned in E. Arikan, "*Channel Polarization: A Method for Constructing Capacity-Achieving Codes for Symmetric Binary-Input Memoryless Channels*", IEEE Trans. Inf. Theory, vol. 55, no. 7, pp. 3051-3073, July 2009, polar codes can be decoded by a successive cancellation decoding algorithm. According to the successive cancellation decoding algorithm, an estimate $\hat{u}_i$ of the bits $u_i$ is obtained based on the channel output $y_1^N$ (i.e., the read or output polar encoded bits/symbols) and all past estimates $\hat{u}_1^{i-1}$. If the bit $u_i$ is a frozen bit, the estimate $\hat{u}_i$ is set to its known value, otherwise $$\hat{u}_i = h_i(y_1^N, \hat{u}_1^{i-1})$$

where $$h_i(y_1^N, \hat{u}_1^{i-1}) = \begin{cases} 0 & \text{if } \ln\left(\frac{W_N^{(i)}(y_1^N, \hat{u}_1^{i-1} \mid u_i = 0)}{W_N^{(i)}(y_1^N, \hat{u}_1^{i-1} \mid u_i = 1)}\right) > 0 \\ 1 & \text{otherwise} \end{cases}$$

In the above expression, $W_N^{(i)} = (W_N^{(1)}, W_N^{(2)}, \ldots, W_N^{(N)})$ represent the N transformed binary input channels that can be synthesized for the bits $u_i = (u_1, u_2, \ldots, u_N)$, respectively, and $$\ln\left(\frac{W_N^{(i)}(y_1^N, \hat{u}_1^{i-1} \mid u_i = 0)}{W_N^{(i)}(y_1^N, \hat{u}_1^{i-1} \mid u_i = 1)}\right) = L_n^{(i)}[l]$$

represents the channel LLR.

Figure 4:
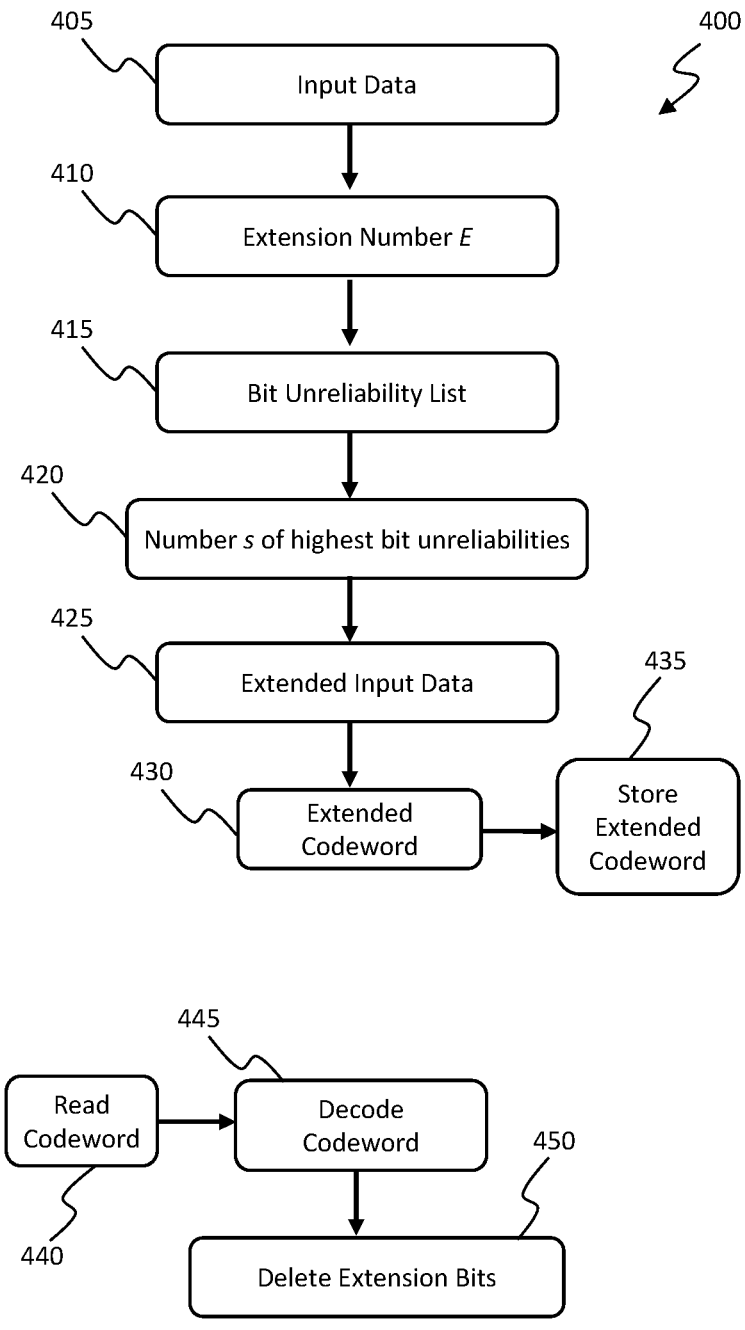
FIG. 4 shows an activity diagram of a method implemented by the SSD controller according to an embodiment of the present invention.

With reference to FIG. 4, it shows an activity diagram of a method 400 implemented by the SSD controller 305 according to an embodiment of the present invention.

Broadly speaking, the method 400 is aimed at encoding, through a polar code, input data to be stored in the SSD device 300 into a codeword, storing the codeword in selected memory cells of the SSD device 300 and properly decoding the stored codeword after reading thereof.

Particularly, as will be apparent from the following discussion, the method 400 allows input data having an arbitrary length (i.e., input data including any number of information bits) to be encoded, through a polar code, into a codeword (hereinafter referred to as target codeword) the code rate of which can be defined by the user and varied by the user over the lifetime of the SSD device 300.

By code rate of the target codeword it is herein meant the proportion of the information bits (i.e. useful, non-redundant bits) included in the target codeword with respect to an overall number of codeword bits making up the target codeword, wherein the codeword bits include both the information bits and a plurality of frozen bits (i.e. non-useful, redundant bits).

The method 400 according to an embodiment of the present invention includes a number of steps, which are individually discussed here below.

Step 405

The input data to be stored in the SSD device 300 is received.

According to an embodiment, the input data includes an array of information bits. According to an embodiment, the input data includes a number K of information bits, i.e. an array of a number K of information bits.

As mentioned above, the aim of the method 400 is to encode, through a polar code, the input data including the number K of information bits into the target codeword, i.e.

a codeword having a code rate which can be defined and varied (or adapted) by the user over the lifetime of the SSD device 300.

Particularly, the aim of the method 400 is to encode, through a polar code, the input data including the number K of information bits into a target codeword having a number N of codeword bits, wherein the number N of codeword bits is variable (and selectable by the user) to obtain variable code rates K/N: the number K of information bits is inherently variable, as the length of the input data typically depends on the specific application in which the SSD device 300 is used—however, for the same application, the number K of information bits is expected to be constant, or low variable (for example, variable within a predictable range of values).

As will be apparent from the following discussion, the present invention applies to any number N of codeword bits; for the purposes of the present disclosure, the worst case scenario will be considered in which the number N of codeword bits (selected by a user) is not a power of two (this being the worst case scenario in that polar codes are limited, by construction, to codeword bits in a number equal to a power of two).

For the purposes of the present disclosure, a code rate K/N means that for every K information bits, a number N of codeword bits is generated through the polar code, of which N−K are redundant (frozen) bits.

Just as a numerical example, let be supposed that K=4096 B (i.e., K=32768=$2^{15}$ bits) and that N=4736 B (i.e., N=37888 bits).

Step 410

An extension number E is determined as the lowest power of two number that is higher than the number N of codeword bits.

Otherwise stated, the extension number E is determined such that E>N and E/2<N.

Back to the numerical example in which K=32768=$2^{15}$ bits and N=37888 bits, then E=65536=$2^{16}$ bits (in that $2^{15}$<N<$2^{16}$).

As will be better understood from the following description, the extension number E is used to extend the length of the input data (e.g., by adding a number of additional redundant bits, hereinafter referred to as extension bits, obtaining corresponding extended input data) to such an extent that the encoding of the extended input data through the polar code results in an extended codeword having a codeword length equal to a power of two (and, particularly, equal to the extension number E), consistently with polar code working (encoding and decoding) principles.

Therefore, as will be better understood from the following description, the extended codeword includes the number K of information bits, the number (N−K) of frozen bits, and such a number of extension bits that the codeword length of the extended codeword is equal to a power of two (particularly, the number of extension bits is E−N): by the logical viewpoint, the extended codeword includes the target codeword and a number E−N of extension bits.

Otherwise stated, the extended codeword includes an array of E codeword bits, wherein the codeword bits of the extended codeword include the number K of information bits, the number (N−K) of frozen bits and a number s=(E−N) extension bits.

Step 415

The information content stored in the SSD device 300 (for example, in the memory location of the control unit 325, as discussed above) is accessed.

As discussed above, according to an embodiment, the information content is indicative of a bit unreliability associated with each bit position in the array of codeword bits. In other words, for each bit position in the array of codeword bits, the information content is indicative of a probability of failure of a bit in that bit position.

Particularly, the information content is indicative of a bit unreliability associated with each bit position in the array of codeword bits of the extended codeword: indeed, as will be understood from the following description, the bit positions associated with the highest bit unreliabilities will be selected as the bit positions where the extension bits are placed to obtain the extended codeword.

As mentioned above, according to an embodiment, each bit unreliability is determined in a characterization phase of the SSD device 300.

According to an embodiment, the information content includes one or more lists each one including an ordered succession of elements. Preferably, the elements of each list are indicative each one of a respective bit position in the array of codeword bits. More preferably, the elements of each list are ordered in the succession by decreasing bit unreliabilities associated with the respective bit positions, the direction of the decreasing order being herein intended from left to right of the respective list.

In other words, according to the preferred embodiment herein considered, the information about the bit unreliability is associated with the position taken by each element (in turn identifying the bit position in the array) in the respective list.

In the example of information content of FIG. 3A, a single list of elements [Px, Py, Pz, . . . Pj, Pk] is illustrated, wherein the bit in the position Px has a higher bit unreliability than the bit in the position Py, which in turn has a higher bit unreliability than the bit in the position Pz, and so on.

According to an alternative embodiment, a plurality of (e.g., two or more) lists are stored in the SSD device 300 (e.g., in the control unit 325 thereof), with each list that may for example be associated with a respective range of codeword lengths of the extended codeword (and, hence, with a respective range of values of the extension number E).

The provision of a plurality of lists each one associated with a respective range of codeword lengths of the extended codeword is based on the fact that, during the characterization phase of the SSD device 300, e.g. also depending on methodologies used to perform the characterization, codewords having different codeword lengths typically originate reciprocally different information contents, i.e. different bit unreliabilities associated with one or more bit positions.

Therefore, at step 415, in case of a plurality of lists, the list corresponding to the codeword length including the extension number E is selected.

Just as an example, two lists may be stored in the SSD device 300, such as a first list having a number of elements equal to E=32768 (which, in practical cases, may be used to obtain extended codewords from input data in which the number K of information bits ranges from 2 kB to 4 kB) and a second list having a number of elements equal to E=65536 (which, in practical cases, may be used to obtain extended codewords from input data in which the number K of information bits ranges from 4 kB to 8 kB).

Back to the numerical example in which K=32768=$2^{15}$ bits, N=37888 bits, and E=65536=$2^{16}$ bits, the second list would be selected and accessed.

Step 420

Among the bit positions in the selected and accessed list, the bit positions associated with a number s of highest bit unreliabilities are selected.

In the preferred, not limiting embodiment herein discussed in which the elements of the list are ordered by decreasing bit unreliabilities (i.e., from left to right of the list), selecting the bit positions associated with a number s of highest bit unreliabilities practically means selecting a number of first elements of the list equal to the numbers (or otherwise stated, selecting the first s elements of the list).

As mentioned above, according to an embodiment, the number s of highest bit unreliabilities is equal to a difference between the extension number E and the number N of codeword bits of the target codeword, i.e.:

$$s=E-N$$

whereby, as mentioned above, the extended codeword resulting from the following steps will include an array of the number E of codeword bits, wherein the array of the number E of codeword bits includes the number K of information bits, the number (N−K) of frozen bits and the number s=(E−N) of extension bits.

Step 425

The extended input data is determined by adding to the input data the number s of extension bits. The values of the extension bits may for example be zero, although this should not be construed limitatively.

According to an embodiment, said adding comprises adding, in the input data, the numbers of extension bits in the bit positions corresponding to the selected number s of highest bit unreliabilities in the list (or the selected list).

Therefore, at this step, the extended input data includes the number K of information bits and the number s=(E 1V) of extension bits.

Step 430

A number of frozen bits equal to a difference between the number N of codeword bits and the number K of information bits—i.e., (N−K)=(E−s−K)—is selected, whereby encoding of the extended input data and the number (N−K) of frozen bits is performed.

According to an embodiment, the selection of the extended input data with a number of frozen bits equal to a difference between the number (N−K) of frozen bits is based on Bhattacharyya rule (see, for example, Erdal Arikan, "*Channel polarization: A method for constructing capacity-achieving codes for symmetric binary-input memoryless channels*", IEEE, which is incorporated herein by reference).

As mentioned above, the extended codeword thus obtained includes the number K of information bits, the number s of extension bits, and the number (N−K) of frozen bits.

Step 435

The extended codeword is stored in selected memory cells of the SSD device 300.

Step 440

The extended codeword is read from the selected memory cells of the SSD device 300.

Step 445

The read extended codeword is decoded.

Without losing generality, decoding of the read extended codeword may for example be performed through a successive cancellation decoding algorithm, the working principles of which have been briefly explained in the foregoing.

Thus, at the end of the decoding, a decoded extended codeword is obtained, which corresponds to the stored extended codeword unless possible residual, uncorrected errors.

Step 450

The number s=(E−N) of extension bits is removed from the decoded extended codeword, thus obtaining back the target codeword including the number K of information bits and the number N of codeword bits.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A method comprising:
   receiving input data to be stored in a solid state storage device, the input data including an array of information bits in a number equal to a first number;
   encoding, through a polar code, said input data into a codeword having an array of codeword bits in a number equal to a second number, the codeword bits including said information bits and a plurality of frozen bits, wherein said second number is variable by a user over a lifetime of the solid state storage device to obtain variable code rates;
   storing the codeword in the solid state storage device;
   reading the codeword from the solid state storage device;
   decoding the codeword being read from the solid state storage device in order to obtain output data corresponding to the input data;
   wherein said encoding comprises:
   determining a third number as the lowest power of two number that is higher than said second number;
   accessing an information content stored in the solid state storage device, the information content being indicative of a bit unreliability associated with each bit position in said array of codeword bits;
   selecting, among the bit positions in the information content, the bit positions associated with a number of highest bit unreliabilities equal to a fourth number, to obtain selected bit positions, said fourth number being equal to a difference between the third number and the second number;
   determining extended input data by adding to the input data a number of redundant bits equal to said fourth number, wherein said adding comprises adding, in the input data, the number of redundant bits in the respective selected bit positions;
   through the polar code, encoding the extended input data and a number of frozen bits equal to a difference between the second number and the first number, thereby obtaining an extended codeword including said codeword;
   wherein said storing the codeword, said reading the codeword and said decoding the codeword include storing the extended codeword, reading the extended codeword and decoding the extended codeword, respectively, and wherein the method further comprises, after said decoding, deleting said added number of redundant bits in order to obtain the output data.

2. The method of claim 1, wherein the information content comprises at least one list each one including an ordered succession of elements, the elements of the at least one list being indicative each one of a respective bit position in the array of codeword bits and being ordered in the succession by decreasing bit unreliabilities associated with the respective bit positions, and wherein said selecting, among the bit positions in the information content, the bit positions associated with a number of highest bit unreliabilities equal to a fourth number comprises selecting a number of first elements of the at least one list equal to the fourth number.

3. The method of claim 2, wherein said at least one list comprises a plurality of lists each one associated with a respective third number, and wherein said selecting, among the bit positions in the information content, the bit positions associated with a number of highest bit unreliabilities equal to a fourth number comprises:

according to the determined third number, selecting a list among the plurality of lists, and selecting a number of first elements of the selected list equal to the fourth number.

4. The method of claim 1, wherein said encoding the extended input data and a number of frozen bits equal to a difference between the second number and the first number is based on Bhattacharyya rule.

5. Controller for a solid state storage device, comprising:

an interface unit for receiving input data to be stored in the solid state storage device, the input data including an array of information bits in a number equal to a first number;

an encoding unit for encoding, through a polar code, said input data into a codeword having an array of codeword bits in a number equal to a second number, the codeword bits including said information bits and a plurality of frozen bits, wherein said second number is variable by a user over a lifetime of the solid state storage device to obtain variable code rates;

a storing unit for storing the codeword in the solid state storage device;

a reading unit for reading the codeword from the solid state storage device;

a decoding unit for decoding the codeword being read from the solid state storage device in order to obtain output data corresponding to the input data;

wherein said encoding unit is configured to:

determine a third number as the lowest power of two number that is higher than said second number;

access an information content stored in the solid state storage device, the information content being indicative of a bit unreliability associated with each bit position in said array of codeword bits;

select, among the bit positions in the information content, the bit positions associated with a number of highest bit unreliabilities equal to a fourth number, to obtain selected bit positions, said fourth number being equal to a difference between the third number and the second number;

determine extended input data by adding to the input data a number of redundant bits equal to said fourth number, wherein said adding comprises adding, in the input data, the number of redundant bits in the respective selected bit positions;

through the polar code, encode the extended input data and a number of frozen bits equal to a difference between the second number and the first number, thereby obtaining an extended codeword including said codeword;

wherein said storing unit, said reading unit and said decoding unit are configured to store the extended codeword, read the extended codeword and decode the extended codeword, respectively, and wherein the controller is configured to, after said decoding, delete said added number of redundant bits in order to obtain the output data.

6. The controller of claim 5, wherein the information content comprises at least one list each one including an ordered succession of elements, the elements of the at least one list being indicative each one of a respective bit position in the array of codeword bits and being ordered in the succession by decreasing bit unreliabilities associated with the respective bit positions, and wherein the encoding unit is configured to select, among the bit positions in the information content, the bit positions associated with a number of highest bit unreliabilities equal to a fourth number by selecting a number of first elements of the at least one list equal to the fourth number.

7. The controller of claim 6, wherein said at least one list comprises a plurality of lists each one associated with a respective third number, and wherein the encoding unit is configured to select, among the bit positions in the information content, the bit positions associated with a number of highest bit unreliabilities equal to a fourth number by:

selecting a list among the plurality of lists according to the determined third number, and selecting a number of first elements of the selected list equal to the fourth number.

8. The controller of claim 5, wherein the encoding unit is configured to encode the extended input data and a number of frozen bits equal to a difference between the second number and the first number based on Bhattacharyya rule.

9. A solid state storage device comprising a controller and a plurality of memory cells, wherein the controller comprises:

an interface unit for receiving input data to be stored in the solid state storage device, the input data including an array of information bits in a number equal to a first number;

an encoding unit for encoding, through a polar code, said input data into a codeword having an array of codeword bits in a number equal to a second number, the codeword bits including said information bits and a plurality of frozen bits, wherein said second number is variable by a user over a lifetime of the solid state storage device to obtain variable code rates;

a storing unit for storing the codeword in memory cells of the solid state storage device;

a reading unit for reading the codeword from the memory cells of the solid state storage device;

a decoding unit for decoding the codeword being read from the memory cells of the solid state storage device in order to obtain output data corresponding to the input data;

wherein said encoding unit is configured to:

determine a third number as the lowest power of two number that is higher than said second number;

access an information content stored in the solid state storage device, the information content being indicative of a bit unreliability associated with each bit position in said array of codeword bits;

select, among the bit positions in the information content, the bit positions associated with a number of highest bit unreliabilities equal to a fourth number, to obtain selected bit positions, said fourth number being equal to a difference between the third number and the second number;

determine extended input data by adding to the input data a number of redundant bits equal to said fourth number, wherein said adding comprises adding, in the input data, the number of redundant bits in the respective selected bit positions;

through the polar code, encode the extended input data and a number of frozen bits equal to a difference between the second number and the first number, thereby obtaining an extended codeword including said codeword;

wherein said storing unit, said reading unit and said decoding unit are configured to store the extended codeword, read the extended codeword and decode the extended codeword, respectively, and wherein the controller is configured to, after said decoding, delete said added number of redundant bits in order to obtain the output data.

10. The solid state storage device of claim 9, wherein the information content comprises at least one list each one including an ordered succession of elements, the elements of the at least one list being indicative each one of a respective bit position in the array of codeword bits and being ordered in the succession by decreasing bit unreliabilities associated with the respective bit positions, and wherein the encoding unit is configured to select, among the bit positions in the information content, the bit positions associated with a number of highest bit unreliabilities equal to a fourth number by selecting a number of first elements of the at least one list equal to the fourth number.

11. The solid state storage device of claim 10, wherein said at least one list comprises a plurality of lists each one associated with a respective third number, and wherein the encoding unit is configured to select, among the bit positions in the information content, the bit positions associated with a number of highest bit unreliabilities equal to a fourth number by:

selecting a list among the plurality of lists according to the determined third number, and selecting a number of first elements of the selected list equal to the fourth number.

12. The solid state storage device of claim 9, wherein the encoding unit is configured to encode the extended input data and a number of frozen bits equal to a difference between the second number and the first number based on Bhattacharyya rule.

13. The solid state storage device of claim 9, wherein the memory cells comprise flash memory cells.

* * * * *